United States Patent [19]

Amin

[11] Patent Number: 4,575,819

[45] Date of Patent: Mar. 11, 1986

[54] MEMORY WITH RAM CELLS AND ROM CELLS

[75] Inventor: Pravin T. Amin, Austin, Tex.

[73] Assignee: Motorola, Inc., Schaumburg, Ill.

[21] Appl. No.: 519,179

[22] Filed: Aug. 1, 1983

[51] Int. Cl.[4] .............................................. G11C 13/00
[52] U.S. Cl. .................................... 365/104; 365/189; 365/230
[58] Field of Search ................ 365/104, 189, 230, 210

[56] References Cited

U.S. PATENT DOCUMENTS 3,753,242  8/1973  Townsend .............................. 365/94

Primary Examiner—Terrell W. Fears
Attorney, Agent, or Firm—Anthony J. Sarli, Jr.; Jeffrey Van Myers; James L. Clingan, Jr.

[57] ABSTRACT

A memory circuit which has both RAM cells and ROM cells along a common row has a ROM cell which is directly connected to the word line for the row but which is not enabled when a logic state opposite to that represented by the ROM cell is attempted to be written into the ROM cell. Consequently the only word line required for enabling the ROM cells is the word line which enables the RAM cells.

5 Claims, 2 Drawing Figures

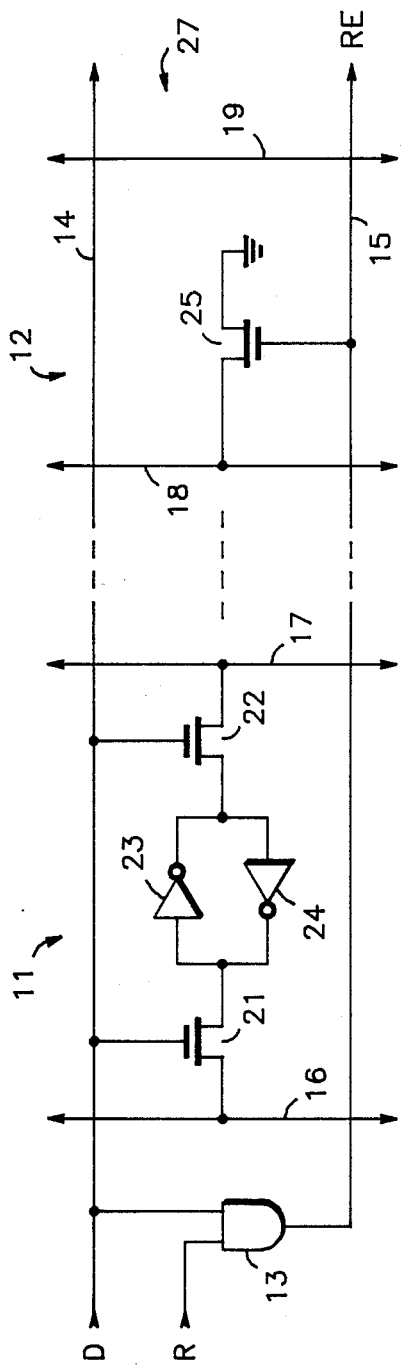
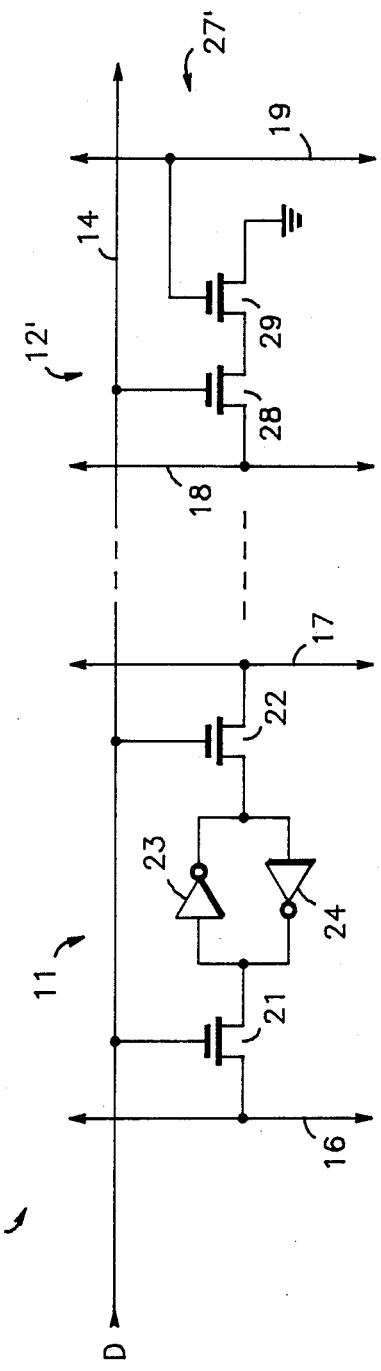
FIG. 1 —PRIOR ART—
FIG. 2

MEMORY WITH RAM CELLS AND ROM CELLS

FIELD OF THE INVENTION

The subject invention relates to memories, and more particularly to memories with RAM cells and ROM cells.

BACKGROUND OF THE INVENTION

In integrated circuit microcomputers, memory circuits accessed by a processing unit are included. Such memory circuits typically have a parallel output in response to an address. The parallel output may be comprised of eight bits which may be called byte-wide. The memory circuits used in a microcomputer system include both random access memories (RAMs) and read only memories (ROMs). In some circumstances elements of both ROMs and RAMs are desired in response to a single address. For example, it may be desirable for some of the bits of a byte to be of a known logic state (ROM) and others to be changeable (RAM).

One of the problems associated with having a byte in memory be both ROM and RAM, is that during a write cycle excessive current may be drawn by the ROM bits. This can occur if a logic state opposite to that of the ROM bit is presented to the ROM bit while the row is enabled, which may occur during a write cycle. One solution to this problem has been to provide a separate word line for the ROM bits which can only be activated during a read cycle. This prevents the ROM bits from drawing current during a write cycle. This extra word line disadvantageously requires space, making the memory larger. Additionally, some additional circuitry is required to ensure that the extra word line is activated only during a read cycle, again increasing size.

SUMMARY OF THE INVENTION

An object of the subject invention is to provide a memory with RAM cells and ROM cells which is improved.

Another object of the invention is to provide a memory with RAM cells and ROM cells with a reduced number of word lines.

Yet another object of the invention is to provide a memory with RAM cells and ROM cells with reduced area requirements.

These and other objects of the subject invention are achieved by a memory circuit having ROM and RAM cells along a common word. A RAM cell provides an output on a first pair of bit lines in response to receiving a row signal from the common word line. A ROM cell is directly connected to the common word line and is coupled to a second pair of bit lines. The ROM cell represents a predetermined logic state, provides logic states representative of the predetermined logic state on the second pair of bit lines in response to receiving the row signal, and is disabled when logic states opposite to those representative of the predetermined logic state are present on the second pair of bit lines.

BRIEF DESCRIPTION OF THE DRAWINGS

FIG. 1 is a schematic diagram of a portion of a memory of the prior art having RAM and ROM bits; and FIG. 2 is a schematic diagram of a portion of a memory having RAM and ROM bits according to a preferred embodiment of the invention.

DETAILED DESCRIPTION OF THE DRAWINGS

Shown in FIG. 1 is a portion 10 of a memory of the prior art comprised generally of a static random access memory (RAM) cell 11, a read only memory (ROM) cell 12, an AND gate 13, a word line 14, a word line 15, a bit line 16, a bit line 17, a bit line 18, and a bit line 19. RAM cell 11 comprises a transistor 21, a transistor 22, an inverter 23, and an inverter 24. ROM cell 12 comprises a transistor 25. Transistors 21, 22 and 25 are N channel insulated gate field effect transistors. Inverters 23 and 24 can be conventional MOS inverters.

AND gate 13 has a first input for receiving a read signal R, a second input for receiving a decoder output signal D, and an output connected to word line 15. Transistor 21 has a first current electrode connected to bit line 16, a control electrode connected to word line 14, and a second current electrode. Inverter 23 has an input connected to the second current electrode of transistor 21, and an output. Inverter 24 has an input connected to the output of inverter 23, and an output connected to the input of inverter 23. Transistor 22 has a first current electrode connected to the output of inverter 23, a control electrode connected to word line 14, and a second current electrode connected to bit line 17. Transistor 25 has a first current electrode connected to bit line 18, a control electrode connected to word line 15, and a second current electrode connected to a reference terminal, shown as ground.

RAM cell 11 and ROM cell 12 are two of several, for example eight, memory cells along a common row 27 which is enabled by signals on word lines 14 and 15. RAM cell 11 couples stored data onto bit lines 16 and 17 in response to a decoder signal D when in a read mode. RAM cell 11 stores data received on bit lines 16 and 17 when in a write mode. This is conventional static RAM operation. ROM cell 12 couples word line 18 to ground when a ROM enable signal RE is present on word line 15. Signal RE is present only in the read mode. The read mode is indicated by signal R being present, a logic high in this case. AND gate 13 provides signal RE at a logic high when both signals R and D are a logic high. Consequently transistor 25 is turned on only in the read mode and when row 27 is selected which is when signal D is a logic high. Consequently, when data is to be read from row 27, data from memory cells 11 and 12 is read on bit lines 16, 17, 18 and 19 by virtue of signals D and RE being a logic high. Any other RAM cells (not shown) along row 27 are connected to word line 14, whereas any other ROM cells (not shown) are connected to word line 15. Prior to reading in a typical static RAM system, all bit lines 16, 17, 18, and 19 are precharged to a logic high. ROM cell 12 accordingly need only be connected to a single bit line, in this case bit line 18, to communicate the desired logic state to bit lines 18 and 19.

Word line 15 is an extra word line from that normally required for a row of static RAM cells. It is required to prevent ROM cell 12 from conducting during the write mode which is indicated by signal R being a logic low. When signal R is a logic low, regardless of the logic state of signal D, AND gate 13 will provide signal RE at a logic low, keeping transistor 25 turned off. Transistor 25 must be kept turned off during the write mode to prevent a large current drain. In a write mode, the desired logic states are driven to the memory cells along row 27 via bit lines, in this case, bit lines 16, 17, 18, and 19. Although the logic state of cell 12 cannot be changed, it is typically not feasible to prevent a logic state from being attempted to be written. If the logic state which is attempted results in the application of a logic high to bit line 18, it is important that ROM cell 12 not be enabled, otherwise there is a current path to ground which will draw excessive current from circuitry (not shown) which is doing the writing. If transistor 25 had its control electrode connected to word line 14, transistor 25 would be turned on in the situation just described with the consequent undesirable current drain. Word line 15 is thus necessary to prevent transistor 25 and other ROM cells (not shown) along row 27 from turning on during the write mode.

Shown in FIG. 2 is a portion 10' of a memory which is comprised generally of static RAM cell 11, word line 14, bit lines 16, 17, 18 and 19, and a ROM cell 12'. Portion 10' has elements which are common to portion 10 of FIG. 1 which are commonly numbered. Portion 10' differs from portion 10 by not having AND gate 13 or word line 15 and by ROM cell 12' being substituted for ROM cell 12. ROM cell 12' comprises a transistor 28 and a transistor 29. Transistor 28 has a first current electrode connected to bit line 18, a control electrode connected to word line 14, and a second current electrode. Transistor 29 has a first current electrode connected to the second current electrode of transistor 28, a control electrode connected to bit line 19, and a second current electrode connected to ground.

In the read mode RAM cell 11 operates the same as described for FIG. 1. ROM cell 12' couples bit line 18 to ground as did ROM cell 12 in FIG. 1 but by using signal D directly. RAM cell 11 and ROM cell 12' are two of several, for example eight, memory cells along a common row 27' which are enabled by signal D being a logic high on word line 14. With bit lines 18 and 19 precharged to a logic high prior to reading, as are all bit lines in a typical static RAM, transistor 29 is turned on. When signal D switches to a logic high to begin reading, transistor 28 also turns on, establishing a current path between bit line 18 and ground. A logic low is thereby established on bit line 18 while the precharged logic high remains on bit line 19. The logic state represented by ROM cell 12' can thus be read by any conventional means. Although transistor 29 will turn on every read cycle, transistor 28 will only turn on when row 27' has been selected by virtue of signal D switching to a logic high. Consequently, the logic state of cell 12' is coupled to bit lines 18 and 19 only if row 27' is selected.

In the write mode RAM cell 11 operates the same as described for FIG. 1. ROM cell 12' is disabled when a logic state opposite to that represented by ROM cell 12' is attempted to be written via bit lines 18 and 19. Reading ROM cell 12' results in bit line 18 being a logic low. To attempt to write the opposite is to drive bit line 18 to a logic high and pull bit line 19 to a logic low. With bit line 19 at a logic low, transistor 29 is turned off, preventing pair of transistors 28 and 29 from providing a current path between bit line 18 and ground. Consequently there is no current pulled by ROM cell 12' from the writing circuitry (not shown). In the case where the same logic state as represented by ROM cell 12' is attempted to be written and row 27' is selected, both of series-connected transistor pair 28 and 29 will be turned on but will not draw current. With a logic low on bit line 18, a logic high on bit line 19, and a logic high on word line 14, transistors 28 and 29 will both be turned on. Current flow, however, if any, between bit line 18 and ground via transistors 28 and 29 will not be significant because of the logic low applied to bit line 18.

ROM cell 12' offers several advantages over ROM cell 12 of FIG. 1 while achieving the same desirable functionality. ROM cell 12' is directly connected to the same word line, word line 14, which enables RAM cell 11 as well as any other RAM cells (not shown) on row 27'. Consequently, no extra word line is required for row 27'. Additionally no extra signal, such as signal RE, must be generated so that there is no need for NAND gate 13. Also read signal R, although certainly necessary for the overall operation of a memory, need not be used as required in FIG. 1. This reduces routing complexity. These advantages are primarily the result of ROM cell 12' being directly connected to word line 14. ROM cell 12' nonetheless is enabled by signal D being present on word line 14 but disabled during the write mode in the situation in which being enabled would result in a current drain. Another advantage of not requiring an additional word line for rows with ROM cells is that in the event it becomes desirable to change a RAM cell to a ROM cell, it is not necessary to alter the array to accommodate the extra word line required if the row did not already have a ROM cell.

Memory cell 12' does require an additional transistor over that required for memory cell 12. Spacing between bit lines 18 and 19, however, is established by the requirements of the RAM cells such as RAM cell 11. Consequently, the chip area required by ROM cell 12' is still less than that which is available. The extra space occupied by cell 12' is space that otherwise would be unused. It is to be understood that other RAM cells on different rows (not shown) are also coupled to bit lines 18 and 19.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. In a memory circuit having ROM and RAM cells along a common word line, wherein a RAM cell provides an output on a first pair of bit lines in response to receiving a row signal from the common word line, the improvement comprising a ROM cell having a pair of series-coupled transistors coupled between a first bit line and a reference terminal, wherein a control electrode of one of the pair of transistors is coupled to said word line and a control electrode of the other of the pair of transistors is coupled to a second bit line.

2. The memory circuit of claim 1 further characterized as having all bit lines precharged prior to said word line receiving the row signal.

3. The memory circuit of claim 2 wherein the pair of transistors are each N channel transistors.

4. The memory circuit of claim 3 wherein the reference terminal is ground.

5. In a memory circuit having ROM and RAM cells along a common word line, wherein a RAM cell provides an output on a first pair of bit lines in response to receiving a row signal from the common word line, the improvement comprising a ROM cell directly connected to said common word line and coupled to a second pair of bit lines, said ROM cell representing a predetermined logic state, providing logic states representative of said predetermined logic state on the second pair of bit lines in response to receiving said row signal, and being disabled when logic states opposite to that representative of said predetermined logic state are present on the second pair of bit lines.

* * * * *